United States Patent
Lai

(10) Patent No.: US 11,408,931 B1
(45) Date of Patent: Aug. 9, 2022

(54) INTEGRATED-CIRCUIT-LEVEL TEST SYSTEM AND METHOD

(71) Applicant: NANYA TECHNOLOGY CORPORATION, New Taipei (TW)

(72) Inventor: Cheng-Sung Lai, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/200,378

(22) Filed: Mar. 12, 2021

(51) Int. Cl.
*G01R 31/10* (2006.01)
*G01R 31/28* (2006.01)

(52) U.S. Cl.
CPC ..... *G01R 31/2863* (2013.01); *G01R 31/2862* (2013.01); *G01R 31/2865* (2013.01)

(58) Field of Classification Search
CPC ............ G01R 31/2862; G01R 31/2863; G01R 31/2865; G01R 31/2867; G01R 31/2868; G01R 31/2856; G01R 31/2875; G01R 31/2893; G01R 31/2806
See application file for complete search history.

(56) References Cited

U.S. PATENT DOCUMENTS

| | | | | |
|---|---|---|---|---|
| 5,184,068 A * | 2/1993 | Twigg | ................... | B07C 5/344 324/757.01 |
| 6,384,593 B1 * | 5/2002 | Kobayashi | ......... | G01R 31/2868 324/750.05 |
| 7,550,964 B2 * | 6/2009 | Dangelo | ............ | G01R 31/2863 324/756.07 |
| 2006/0066293 A1 * | 3/2006 | Gopal | ................ | G01R 31/2849 324/750.14 |
| 2009/0199395 A1 * | 8/2009 | Shim | .................. | G01R 31/2893 414/754 |
| 2016/0334462 A1 * | 11/2016 | Jung | .................. | G01R 31/2867 |
| 2020/0379033 A1 * | 12/2020 | Chang | ................ | G01R 31/2875 |

* cited by examiner

*Primary Examiner* — Thang X Le
(74) *Attorney, Agent, or Firm* — Muncy, Geissler, Olds & Lowe, P.C.

(57) ABSTRACT

The present disclosure provides an integrated-circuit-level (IC-level) test method and system. The IC-level test method includes the operations of: providing, by a stage wagon, a plurality of burn-in boards to an IC loading chamber; determining, by the IC loading chamber, at least one disposing configuration for a plurality of ICs according to at least one docking mechanism of the stage wagon; disposing, by the IC loading chamber, the plurality of ICs on each of the plurality of burn-in boards according to the at least one disposing configuration; providing, by the stage wagon, the plurality of burn-in boards with the plurality of ICs to a test chamber; and performing, by the test chamber, a test function on the plurality of ICs to determine a status of each of the plurality of ICs.

20 Claims, 22 Drawing Sheets

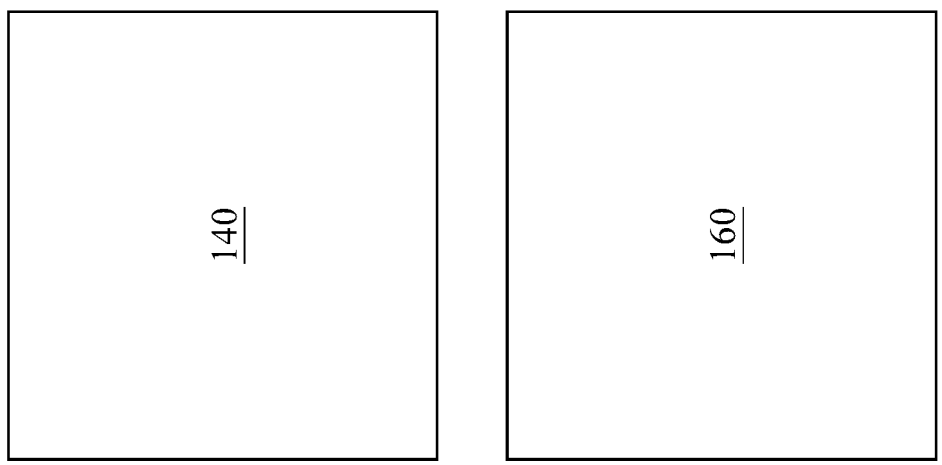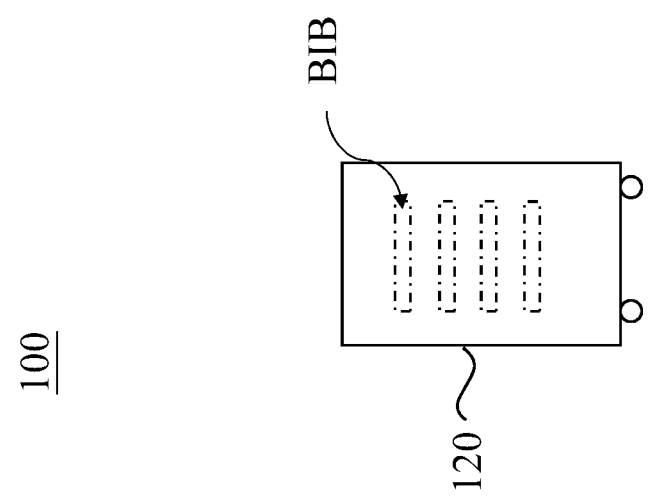
FIG. 1

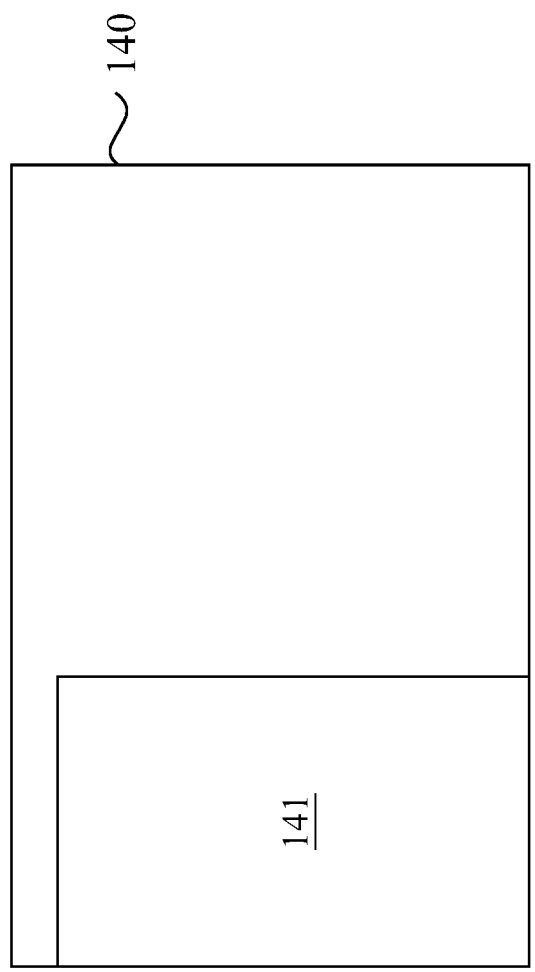
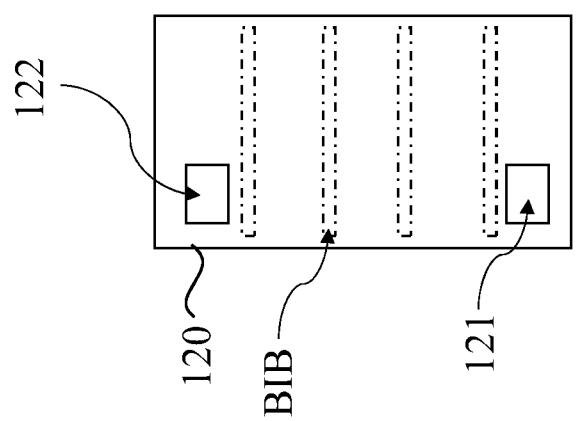
FIG. 5

INTEGRATED-CIRCUIT-LEVEL TEST SYSTEM AND METHOD

TECHNICAL FIELD

The present disclosure relates to a test system and method, and more particularly, to an integrated-circuit-level (IC-level) test system and method.

DISCUSSION OF THE BACKGROUND

In IC-level tests (such as an aging test), the throughput of every test is tend to increase due to saving time in each process cycle. The burn-in board are designed to carry ICs when the ICs are tested. However, when the throughput of the test increases, the number of the burn-in boards and the total weight of the burn-in boards increases as well. Therefore, the transportation of the burn-in boards becomes a heavy duty which might be easily inclined and/or collided. As a result, the stability and efficiency of transporting the burn-in boards becomes a critical issue in the field of IC-level tests.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an integrated-circuit-level (IC-level) test method. The IC-level test method includes the operations of: providing, by a stage wagon, a plurality of burn-in boards to an IC loading chamber; determining, by the IC loading chamber, at least one disposing configuration for a plurality of ICs according to at least one docking mechanism of the stage wagon; disposing, by the IC loading chamber, the plurality of ICs on each of the plurality of burn-in boards according to the at least one disposing configuration; providing, by the stage wagon, the plurality of burn-in boards with the plurality of ICs to a test chamber; and performing, by the test chamber, a test function on the plurality of ICs to determine a status of each of the plurality of ICs.

In some embodiments, the IC-level test method further includes the operations of: after the status of each of the plurality of ICs is determined, providing, by the stage wagon, the plurality of burn-in boards to the IC loading chamber; and categorizing, by the IC loading chamber, the plurality of ICs according to the status of each of the plurality of ICs.

In some embodiments, the operation of providing the plurality of burn-in boards to the IC loading chamber includes docking a first docking mechanism of the stage wagon at a first receiving mechanism of a loading port of the IC loading chamber.

In some embodiments, the operation of determining the at least one disposing configuration according to the at least one docking mechanism of the stage wagon includes the operations of: sensing, by the first receiving mechanism, whether the first docking mechanism is docked at the first receiving mechanism; and when the first docking mechanism is docked at the first receiving mechanism, determining a first disposing configuration for the plurality of ICs.

In some embodiments, the operation of providing the plurality of burn-in boards to the IC loading chamber further includes docking a second docking mechanism of the stage wagon at a second receiving mechanism of the loading port of the IC loading chamber, wherein the first docking mechanism is different from the second docking mechanism, and the first receiving mechanism is different from the second receiving mechanism.

In some embodiments, the operation of determining the at least one disposing configuration according to the at least one docking mechanism of the stage wagon further includes the operations of sensing, by the second receiving mechanism, whether the second docking mechanism is docked at the second receiving mechanism; and when the first docking mechanism is docked at the first receiving mechanism and the second docking mechanism is docked at the second receiving mechanism, determining a second disposing configuration for the plurality of ICs, wherein the second disposing configuration is different form the first disposing configuration.

In some embodiments, the operation of disposing the plurality of ICs on each of the plurality of burn-in boards according to the at least one disposing configuration includes the operations of: transporting the plurality of burn-in boards from the stage wagon to the IC loading chamber; disposing the plurality of ICs on each of the plurality of burn-in boards according the first disposing configuration or the second disposing configuration; and transporting the plurality of burn-in boards from the IC loading chamber to the stage wagon.

In some embodiments, the plurality of burn-in boards are transported in their entirety at once from the stage wagon to the IC loading chamber.

In some embodiments, the operation of performing the test function on the plurality of ICs to determine the status of each of the plurality of ICs includes the operations of: transporting the plurality of burn-in boards from the stage wagon to the test chamber; transmitting a plurality of first test signals to the plurality of burn-in boards; receiving a plurality of second test signal from the plurality of burn-in boards in response to the plurality of first test signal; determining the status of each of the plurality of ICs according to the plurality of second test signal; and transporting the plurality of burn-in boards from the test chamber to the stage wagon.

In some embodiments, the plurality of burn-in boards are transported in their entirety at once from the stage wagon to the test chamber.

Another aspect of the present disclosure provides an IC-level system. The IC-level test system includes a stage wagon, an IC loading chamber, and a test chamber. The stage wagon is configured to provide a plurality of burn-in boards. The stage wagon includes at least one docking mechanism. The IC loading chamber is configured to determine at least one disposing configuration for a plurality of ICs according to the at least one docking mechanism of the stage wagon, and configured to disposing the plurality of ICs on each of the plurality of burn-in boards according to the at least one disposing configuration. The test chamber is configured to perform a test function on the plurality of ICs to determine a status of each of the plurality of ICs.

In some embodiments, the IC loading chamber is further configured to categorize the plurality of ICs according to the status of each of the plurality of ICs.

In some embodiments, the stage wagon includes a first docking mechanism, and the IC loading chamber includes a loading port. The loading port includes a first receiving mechanism, and the first receiving mechanism is configured to dock the first docking mechanism of the stage wagon.

In some embodiments, the IC loading chamber is further configured to sense whether the first docking mechanism is docked at the first receiving mechanism by the first receiving mechanism. When the first docking mechanism is docked at the first receiving mechanism, the IC loading chamber determines a first disposing configuration for the plurality of ICs.

In some embodiments, the stage wagon further includes a second docking mechanism, and the loading port of the IC loading chamber further includes a second receiving mechanism, wherein the second receiving mechanism is configured to dock the second docking mechanism of the stage wagon. The first docking mechanism is different from the second docking mechanism, and the first receiving mechanism is different from the second receiving mechanism.

In some embodiments, the IC loading chamber is further configured to sense whether the second docking mechanism is docked at the second receiving mechanism by the second receiving mechanism. When the first docking mechanism and the second docking mechanism are docked at the first receiving mechanism and the second receiving mechanism, respectively, the IC loading chamber determines a second disposing configuration for the plurality of ICs. The second disposing configuration is different from the first disposing configuration.

In some embodiments, the stage wagon is configured to provide the plurality of burn-in boards by transporting the plurality of burn-in boards from the stage wagon to the loading port of the IC loading chamber.

In some embodiments, the plurality of burn-in boards are transported in their entirety at once from the stage wagon to the loading port of the IC loading chamber.

In some embodiments, the stage wagon is configured to provide the plurality of burn-in boards by transporting the plurality of burn-in boards from the stage wagon to the test chamber.

In some embodiments, the plurality of burn-in boards are transported in their entirety at once from the stage wagon to the test chamber.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIG. 1 is a schematic view of an IC-level test system according to some embodiments of the present disclosure.

FIG. 5, FIG. 6, FIG. 7, FIG. 8, FIG. 9, and FIG. 10 are schematic views of operations of an IC loading chamber and a stage wagon according to some embodiments of the present disclosure.

DETAILED DESCRIPTION

Figure 2:
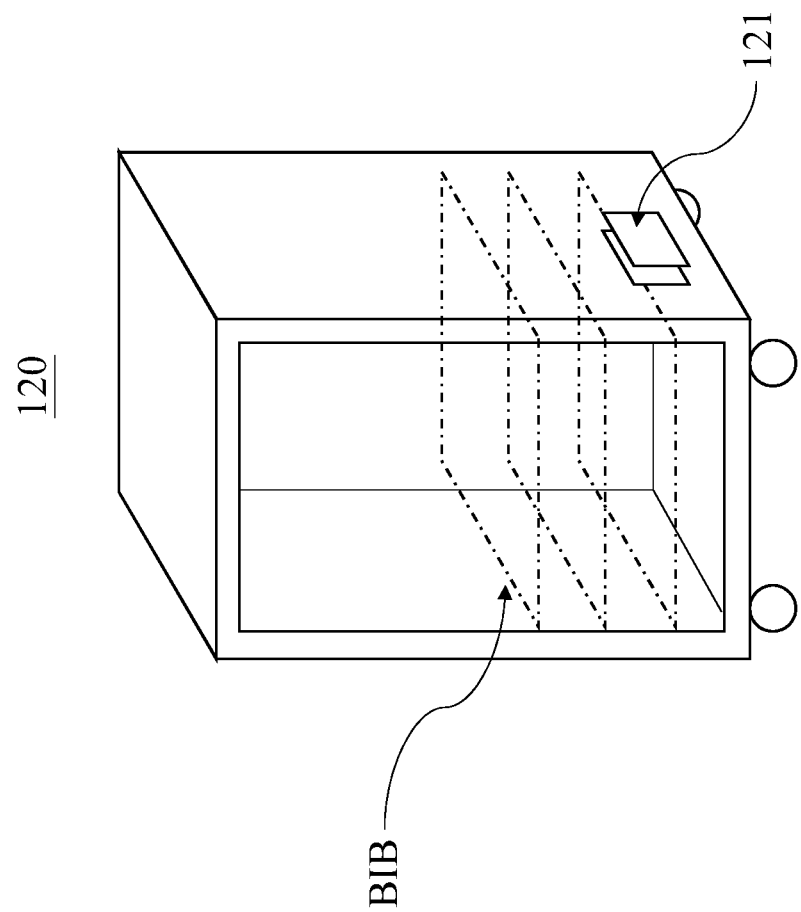
FIG. 2 is a schematic view of a stage wagon of an IC-level test system according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of an IC-level test system 100 according to some embodiments of the present disclosure. The IC-level test system 100 is configured to verify a plurality of ICs whether each of the ICs meets the minimum requirements. In some embodiments, the IC-level test system is configured to verify the ICs by performing an aging test. The ICs are stress tested in order to detect early failures which are cause by defects in design, manufacturing, and/or materials. It is noted that the test being performed by the IC-level test system 100 to the ICs is not limited thereto. Various tests are within the contemplated scope of the present disclosure.

When the ICs are tested, the ICs are carried by burn-in boards BIB. In some embodiments, the burn-in boards BIB are implemented by printed circuit board (PCB). The burn-in boards BIB provide the ICs electric connections to the IC-level test system 100. The IC-level test system 100 thus performs the test by using the electric connections.

As illustrated in FIG. 1, the IC-level test system includes a stage wagon 120, an IC loading chamber 140, and a test chamber 160. The stage wagon 120 is configured to carry the burn-in boards BIB, and configured to transport the burn-in boards BIB within the IC-level test system 100, for example, transporting the burn-in boards BIB from the IC loading chamber 140 to the test chamber 160. The IC loading chamber 140 is configured to dispose the ICs to each of the burn-in boards BIB prior to the test being performed, and configured to collect the ICs from each of the burn-in boards BIB after the test is finished. The test chamber 160 is configured to perform a test function on the ICs to determine a status of each of the ICs. The IC loading chamber 140 is further configured to categorize the ICs according to the status of each of the ICs.

Figure 3:
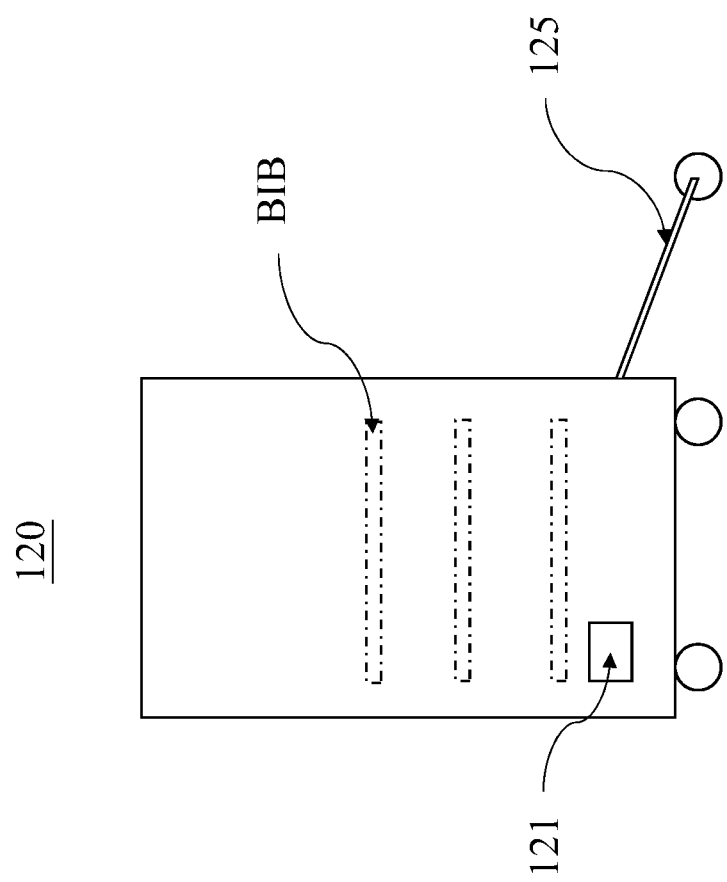
FIG. 3 is a schematic view of a stage wagon of an IC-level test system from a side view of the stage wagon according to some embodiments of the present disclosure.
Figure 4:
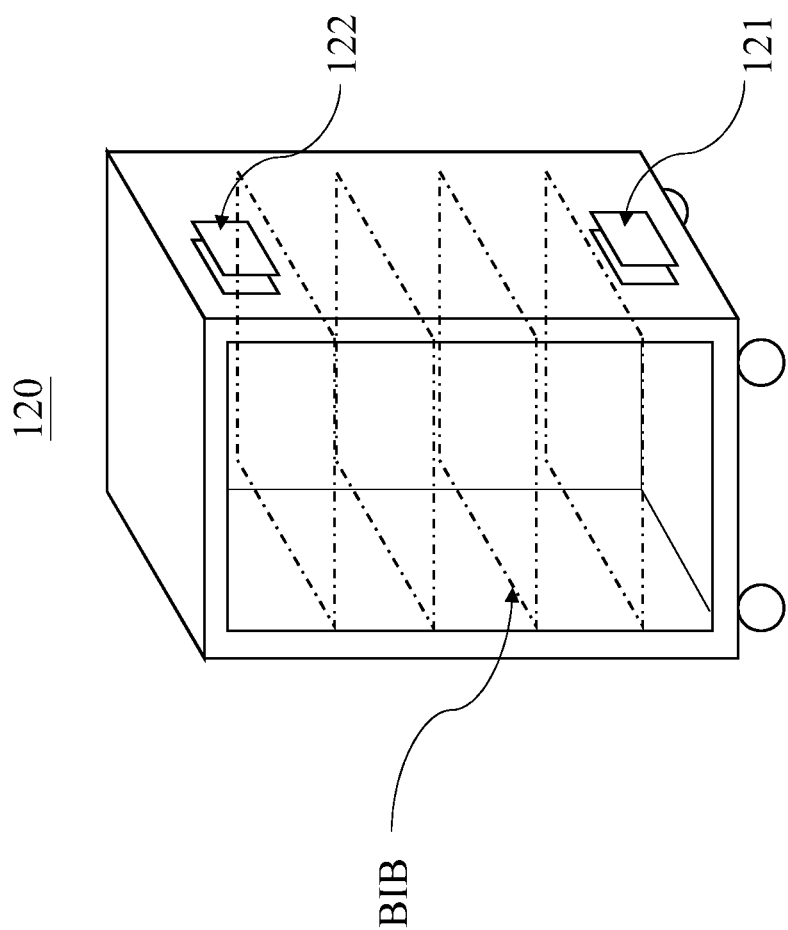
FIG. 4 is a schematic view of a stage wagon of an IC-level test system according to other embodiments of the present disclosure.

The ICs disposed by the IC loading chamber 140 in a test performed the test chamber 160 are identical to each other. However, the IC loading chamber 140 is able to dispose different kinds of ICs in different processes with different tests. In some embodiments, the ICs are disposed in a particular disposing configuration corresponding to the kinds of the ICs. Thereby, the IC loading chamber 140 is configured to determine the disposing configuration for the ICs in the current process. In some embodiments, the IC loading chamber 140 determine the disposing configuration for the ICs according to the stage wagon 120. Reference is made to FIG. 2, FIG. 3, and FIG. 4 for detailed operations of determining the disposing configuration.

FIG. 2 is a schematic view of the stage wagon 120 of the IC-level test system 100 according to some embodiments of the present disclosure. FIG. 3 is a schematic view of the stage wagon 120 of the IC-level test system 100 from a side view of the stage wagon 120 according to some embodiments of the present disclosure FIG. 4 is a schematic view of the stage wagon 120 of the IC-level test system 100 according to other embodiments of the present disclosure.

As illustrated in FIG. 2, the stage wagon 120 is configured to carry the burn-in boards BIB stacking in the stage wagon 120. In order to dispose the ICs and prevent collision, each of burn-in boards BIB has a headroom between each other in the stage wagon 120. The stage wagon 120 includes a docking mechanism 121. The docking mechanism is configured to dock the IC loading chamber 140 when the stage wagon 120 provides the burn-in boards BIB to the IC loading chamber 140. In some embodiments, the burn-in boards BIB are heavy, for example, about 5 to about 6 KG for each burn-in board BIB. Moreover, the stage wagon 120 is able to carry many burn-in boards BIB, such as about 30 to 60 burn-in boards BIB, which may be up to about 150 to 360 KG in total. When the docking mechanism 121 is docked to the IC loading chamber 120, the stage wagon 120 is prone to be stable even if the burn-in boards BIB are heavy.

As illustrated in FIG. 3, in some embodiments, the stage wagon 120 further includes a support mechanism 125. The support mechanism 125 is configured to enhance the stability of the stage wagon 120 when the burn-in boards BIB on the stage wagon 120 are heavy. For example, when the stage wagon 120 is moving, the support mechanism 120 provides an additional supporting point for the stage wagon 120. Because of the support mechanism 125, the stage wagon 120 has lower chance to incline.

As illustrated in FIG. 4, the stage wagon 120 further includes a docking mechanism 122 compared to the stage wagon 120 shown in FIG. 2. In some embodiments, the stage wagon 120 shown in FIG. 4 includes the support mechanism 125 (not shown in FIG. 4).

As mentioned above, the IC loading chamber 140 disposes the ICs by using different disposing configurations according to the kinds of the ICs. The kind of the ICs disposed at the burn-in boards BIB carried by the stage wagon 120 shown in FIG. 2 is different from the kind of the ICs disposed at the burn-in boards BIB carried by the stage wagon 120 shown in FIG. 4. Therefore, the disposing configuration for the ICs on the burn-in boards BIB carried by the stage wagon 120 shown in FIG. 2 is different from the disposing configuration for the ICs on the burn-in boards BIB carried by the stage wagon 120 shown in FIG. 4. The IC loading chamber 140 is configured to determine which disposing configuration would be used according to the docking mechanism 121 and the docking mechanism 122 of the stage wagon 120. Alternatively stated, different stage wagons 120 carry the burn-in boards BIB with different kinds of ICs.

Reference is made to FIG. 5, FIG. 6, FIG. 7, FIG. 8, FIG. 9, and FIG. 10. FIG. 5, FIG. 6, FIG. 7, FIG. 8, FIG. 9, and FIG. 10 are schematic views of operations of the IC loading chamber 160 and the stage wagon 120 according to some embodiments of the present disclosure.

As illustrated in FIG. 5, the IC loading chamber 140 includes a loading port 141, and the loading port 141 is configured to receive the stage wagon 120. In FIG. 5, the stage wagon 120 provides the burn-in boards BIB to the loading port 141 of the IC loading chamber 140. The stage wagon 120 shown in FIG. 5 includes the docking mechanism 121 and the docking mechanism 122, which corresponds the stage wagon 120 in the embodiments of FIG. 4. However, it is noted that the stage wagon 120 in FIG. 5 can correspond to the stage wagon 120 in the embodiments of FIG. 2.

Figure 6:
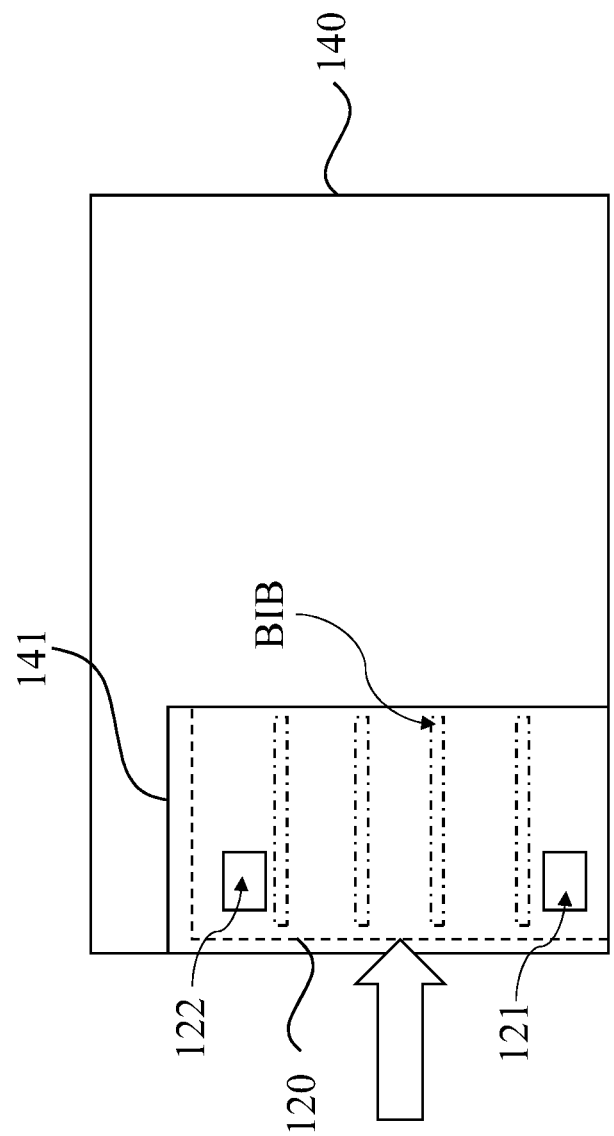

As illustrated in FIG. 6, the stage wagon 120 is docked at the loading port 141 of the IC loading chamber 140.

In some approaches, the PCBs for aging test are carried manually one by one from the wagon to the IC loading chamber 140. Because the PCBs are heavy, inclination and collision easily happen during the manually carrying. When the PCBs are collided, the ICs disposed thereon are early damaged. As a result, the cost increases and the throughput of the aging test decreases. In addition, the PCBs are transported one by one, which costs huge time and elongates the process cycle.

Compared to the above approaches, the burn-in boards BIB are provided by the stage wagon 120 in their entirety to the IC loading chamber 140 at once. Therefore, the issue of inclination and the collision decreases, and the efficiency of the test increases.

Figure 7:
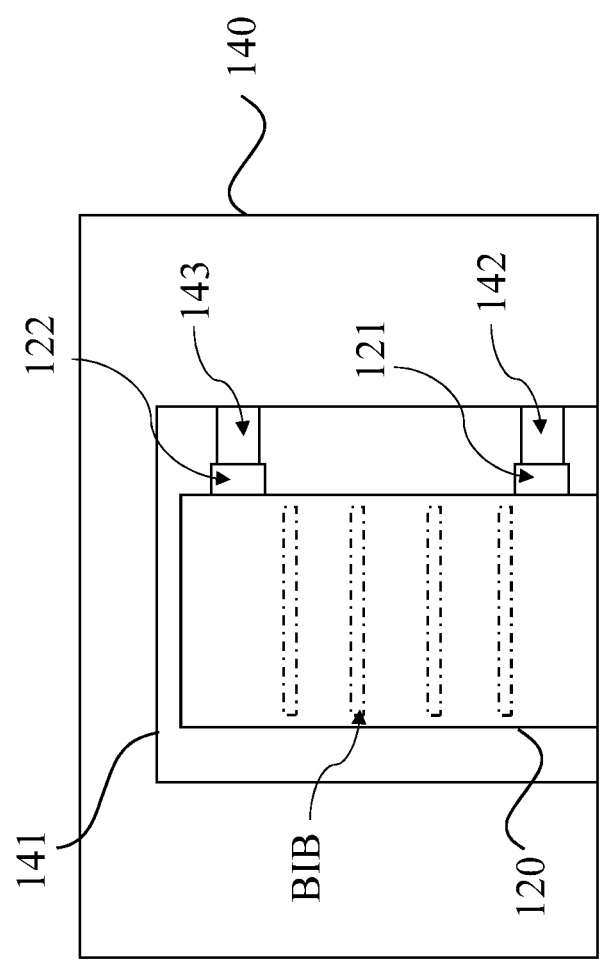

FIG. 7 is a schematic view of the IC loading chamber 140 with the docked stage wagon 120 from a side view of the IC loading chamber 140 according to some embodiments of the present disclosure. As illustrated in FIG. 7, the loading port 141 of the IC loading chamber 140 includes a receiving mechanism 142 and a receiving mechanism 143. The receiving mechanism 142 is configured to dock the docking mechanism 121 of the stage wagon 120. The receiving mechanism 143 is configured to dock the docking mechanism 122 of the stage wagon 120.

Figure 8:
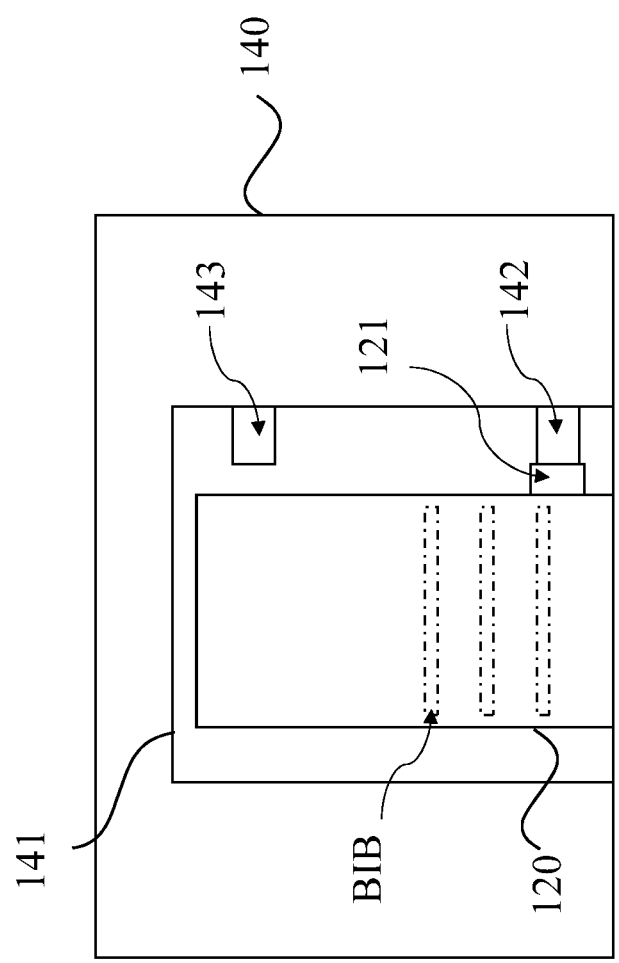

FIG. 8 is a schematic view of the IC loading chamber 140 with the docked stage wagon 120 from the side view of the IC loading chamber 140 according to other embodiments of the present disclosure. As illustrated in FIG. 8, the stage wagon 120 does not include the docking mechanism 122 compared to FIG. 7. Hence, the receiving mechanism 143 is spared.

The IC loading chamber 140 is configured to determine the disposing configuration for the ICs to dispose on the burn-in board BIB. More specifically, the IC loading chamber 140 determines the disposing configuration according to the receiving mechanism 142 and the receiving mechanism 143 of the loading port 141. The IC loading chamber 140 senses whether the docking mechanism 121 and/or the docking mechanism 122 are docked at the receiving mechanism 142 and/or the receiving mechanism 143.

When the docking mechanism 121 and the docking mechanism 122 are docked at the receiving mechanism 142 and the receiving mechanism 143, respectively, the IC loading chamber 140 determine a disposing configuration corresponding to the stage wagon 120 shown in FIG. 4.

When the docking mechanism 121 is docked at the receiving mechanism 142 and the receiving mechanism 143 is spared, the IC loading chamber 140 determine a disposing configuration corresponding to the stage wagon 120 shown in FIG. 2.

Figure 9:
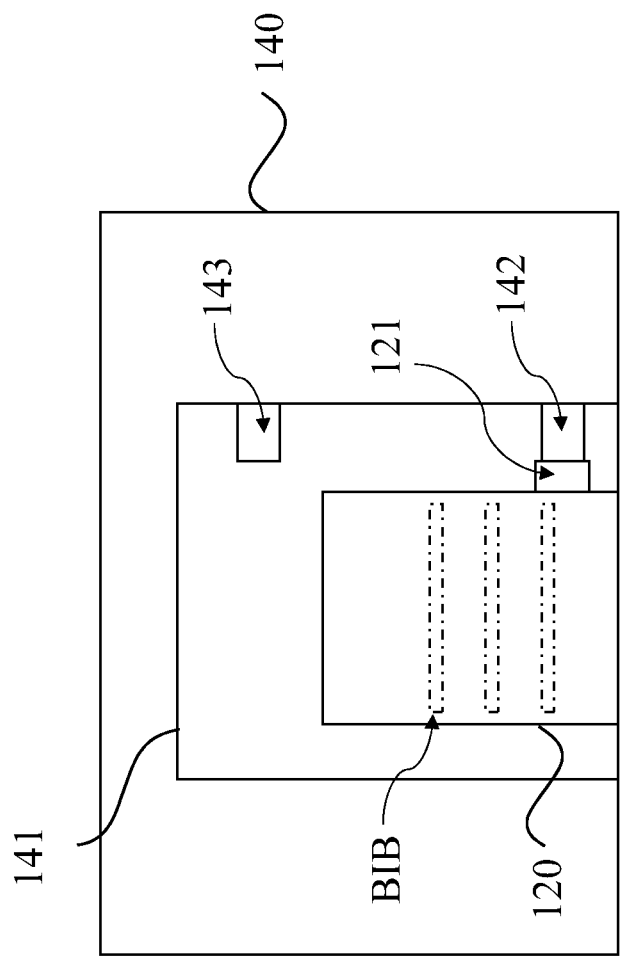

The stage wagon 120 shown in FIG. 2 has a first capability to carry the burn-in boards BIB, and the stage wagon 120 shown in FIG. 4 has a second capability to carry the burn-in boards BIB. In some embodiments, the first capability is less than the second capability. For example, the first capability of the stage wagon 120 shown in FIG. 2 allows about 30 boards being carried, and the second capability of the stage wagon 120 shown in FIG. 4 allows about 64 boards being carried In some embodiments, the stage wagon 120 shown in FIG. 2 has a first height, and the stage wagon 120 shown in FIG. 4 has a second height. In some embodiments, the first height is lower than the second height. When the stage wagon 120 having the first height, the stage wagon 120 does not reach the receiving mechanism 143 of the loading port 141 of the IC loading chamber 140 as illustrated in FIG. 9. The IC loading chamber 140 is further configured to sense the height of the stage wagon 143 through the receiving mechanism 142 and the receiving mechanism 143 to determine the disposing configuration for the ICs.

After the stage wagon 120 is docked at the loading port 141, the burn-in boards BIB are transported from the stage wagon 120 to the IC loading chamber 140 through the loading port 141 of the IC loading chamber 140.

Figure 10:
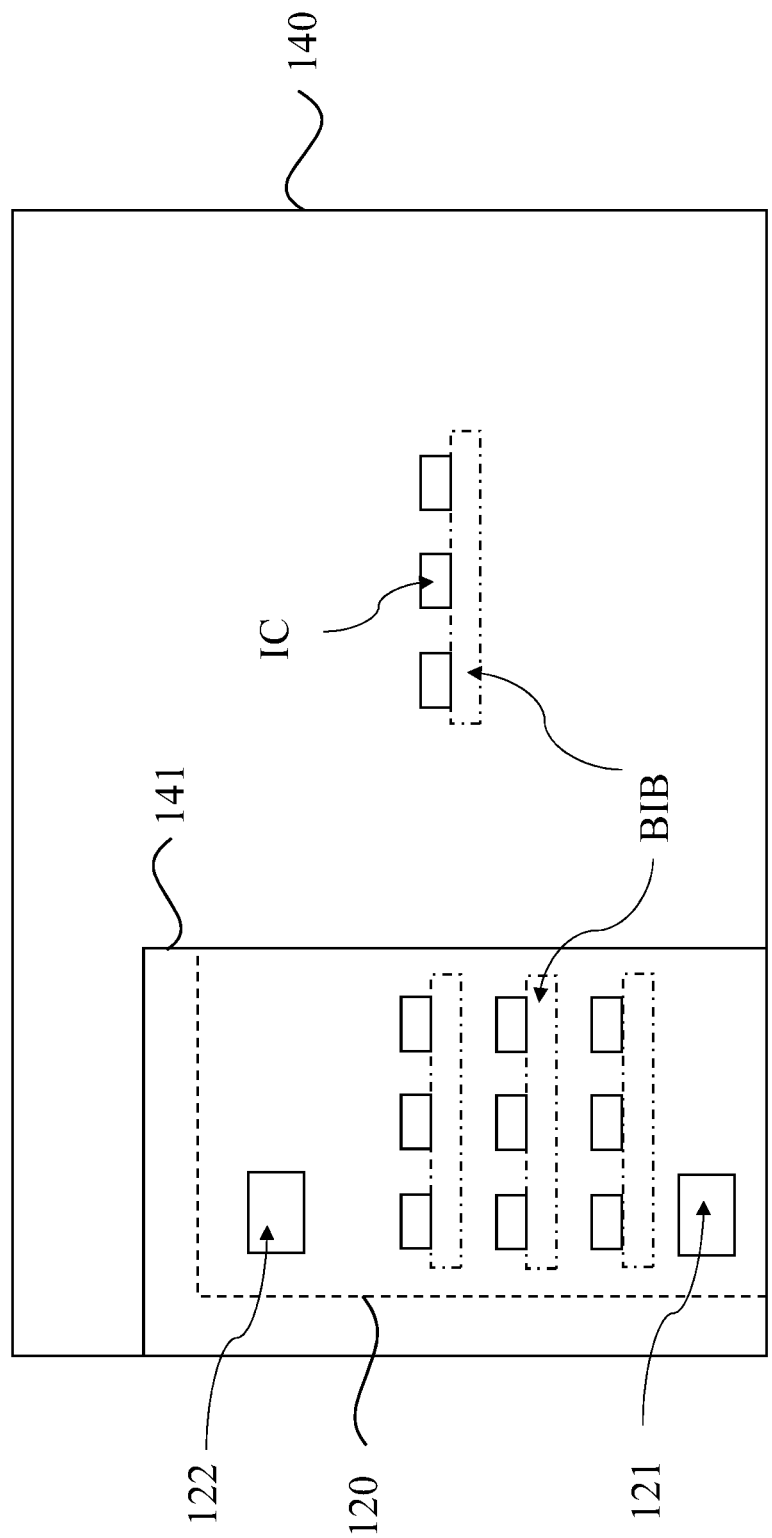

As illustrated in FIG. 10, the IC loading chamber 140 disposes the ICs on each of the burn-in boards BIB according to the determined disposing configuration. In some embodiments, one burn-in board BIB is transported into the IC loading chamber 140 through the loading port 141 at once. When the instant burn-in board BIB with the ICs are transported back to the stage wagon 120, the stage wagon 120 transports a next burn-in board BIB to the IC loading chamber 140.

In some embodiments, the IC loading chamber 140 includes a mechanical arm (not shown in FIG. 10) configured to dispose the ICs on the burn-in boards BIB.

Figure 11B:
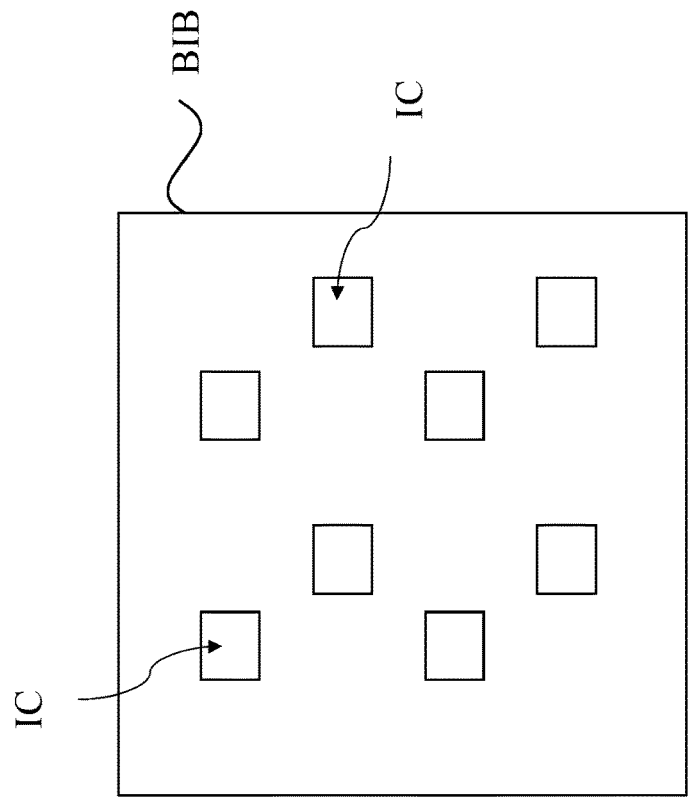
FIG. 11b is a schematic view of another disposing configuration for ICs from a top view of the burn-in board according to other embodiments of the present disclosure.
Figure 11A:
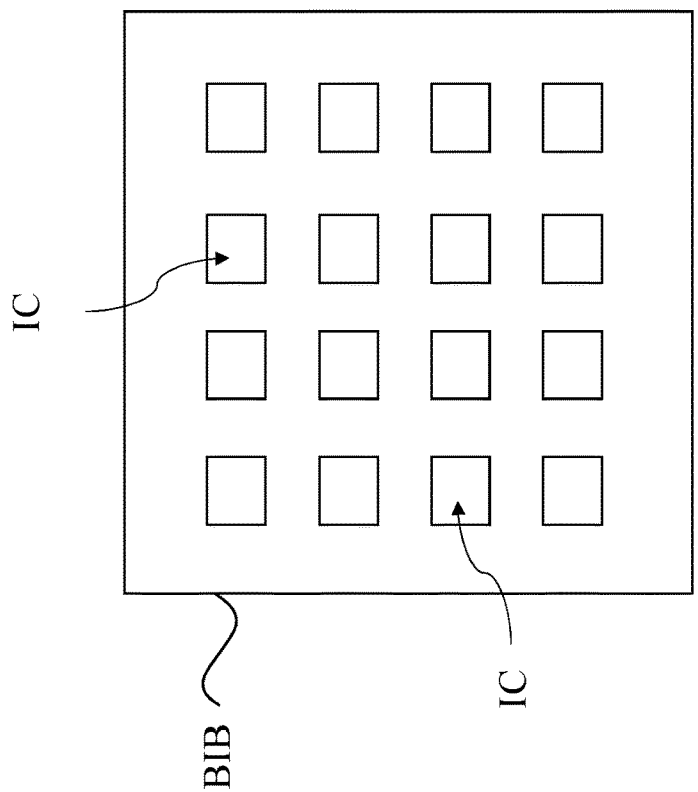
FIG. 11a is a schematic view of a disposing configuration for ICs from a top view of the burn-in board according to some embodiments of the present disclosure.

Reference is made to FIG. 11a and FIG. 11b. FIG. 11a and FIG. 11b are schematic views of different disposing configurations for ICs from a top view of the burn-in board BIB according to various embodiments of the present disclosure. In some embodiments, the disposing configuration shown in FIG. 11a corresponds to the stage wagon 120 shown in FIG. 2, and the disposing configuration shown in FIG. 11b corresponds to the stage wagon 120 shown in FIG. 4. In other embodiments, the disposing configuration shown in FIG. 11a corresponds to the stage wagon 120 shown in FIG. 4, and the disposing configuration shown in FIG. 11b corresponds to the stage wagon 120 shown in FIG. 2.

In FIG. 11a, the ICs are array-like disposed on each of the burn-in boards BIB. In FIG. 11b, the ICs are alternately disposed on each of the burn-in boards BIB. The disposing configurations shown in FIG. 11a and FIG. 11b are provided for illustrative purposes. Various disposing configurations are within the contemplated scope of the present disclosure.

Figure 12:
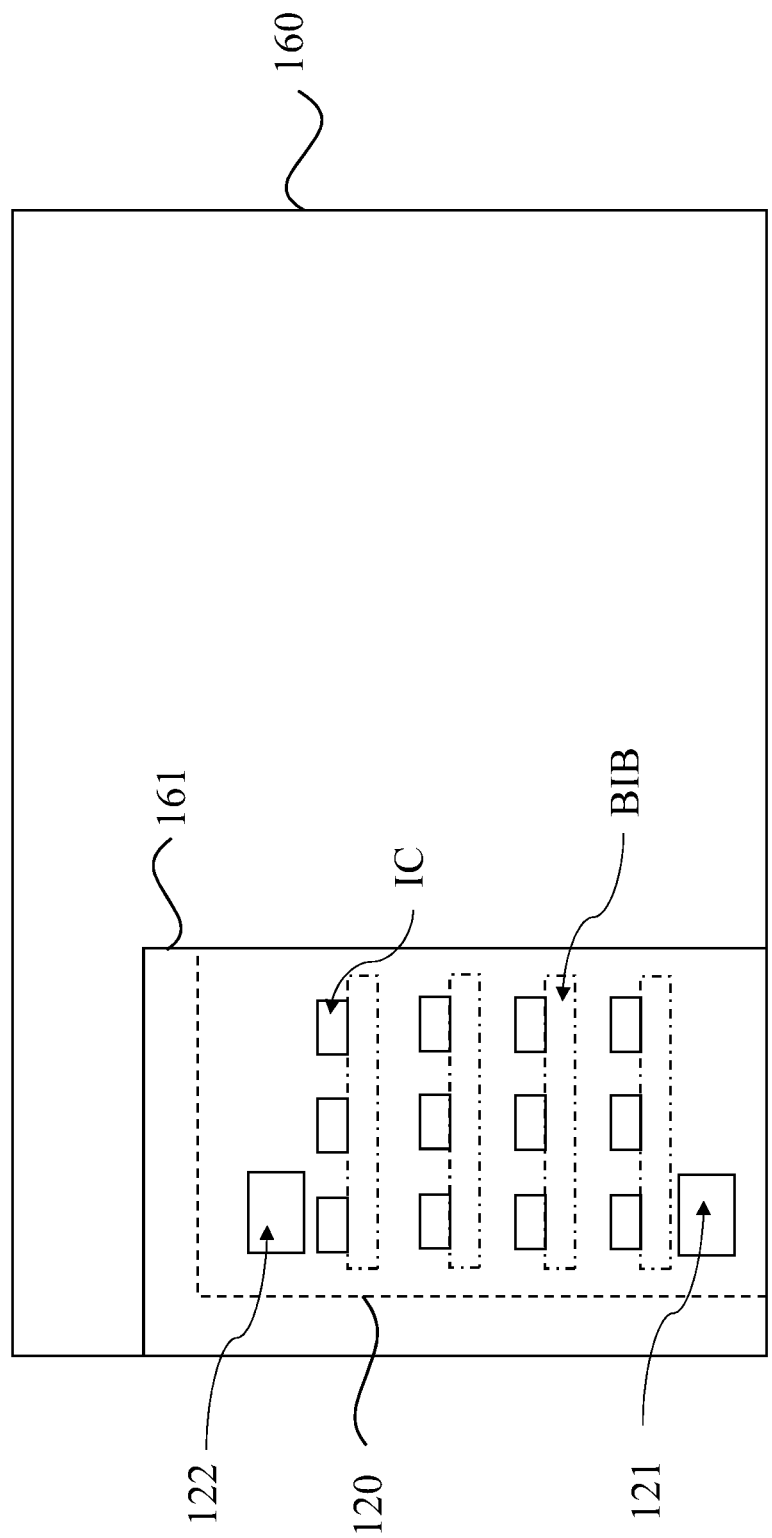
FIG. 12, FIG. 13, and FIG. 14 are schematic views of operations of a test chamber and a stage wagon according to some embodiments of the present disclosure.
Figure 13:
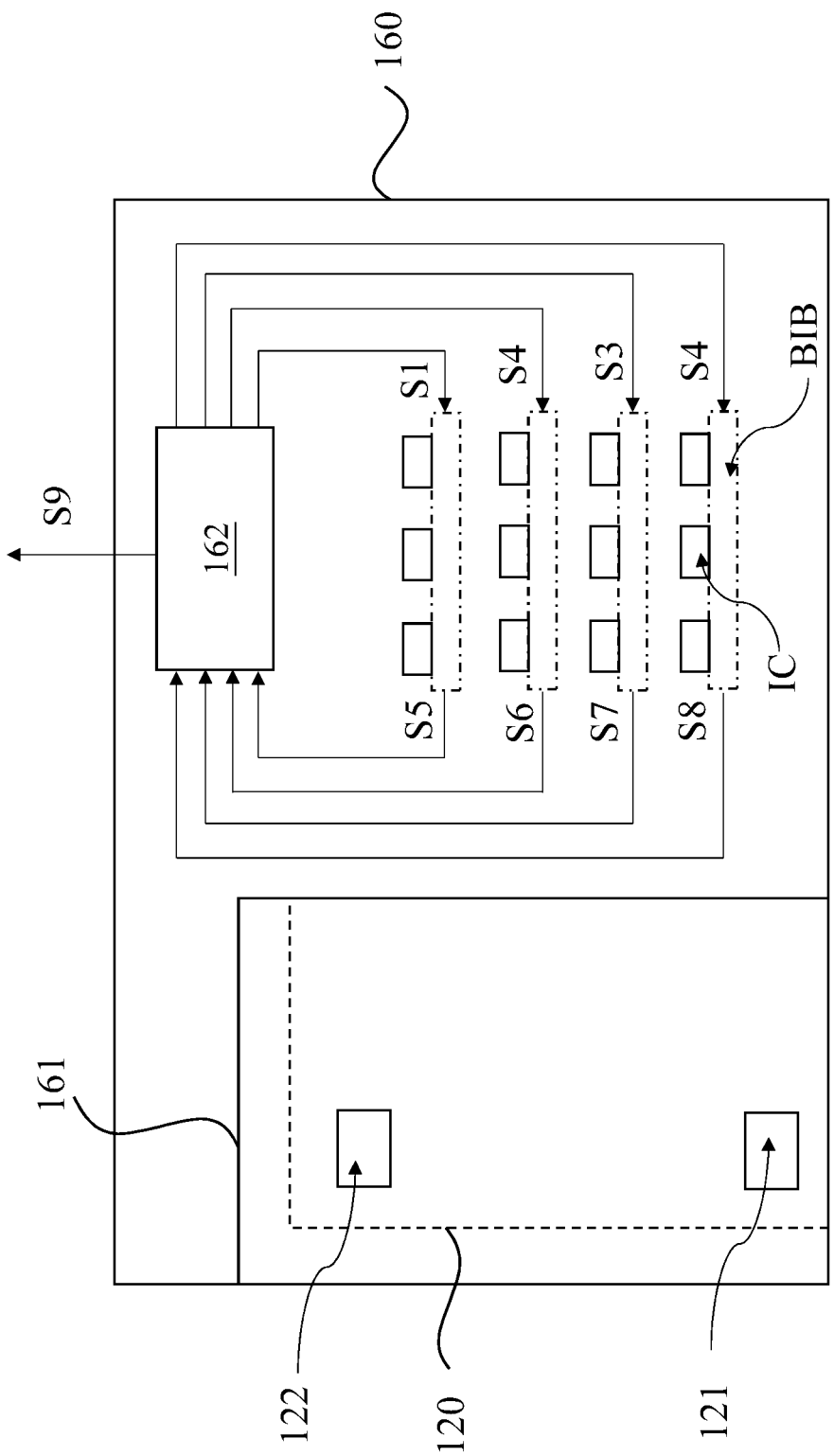
Figure 14:
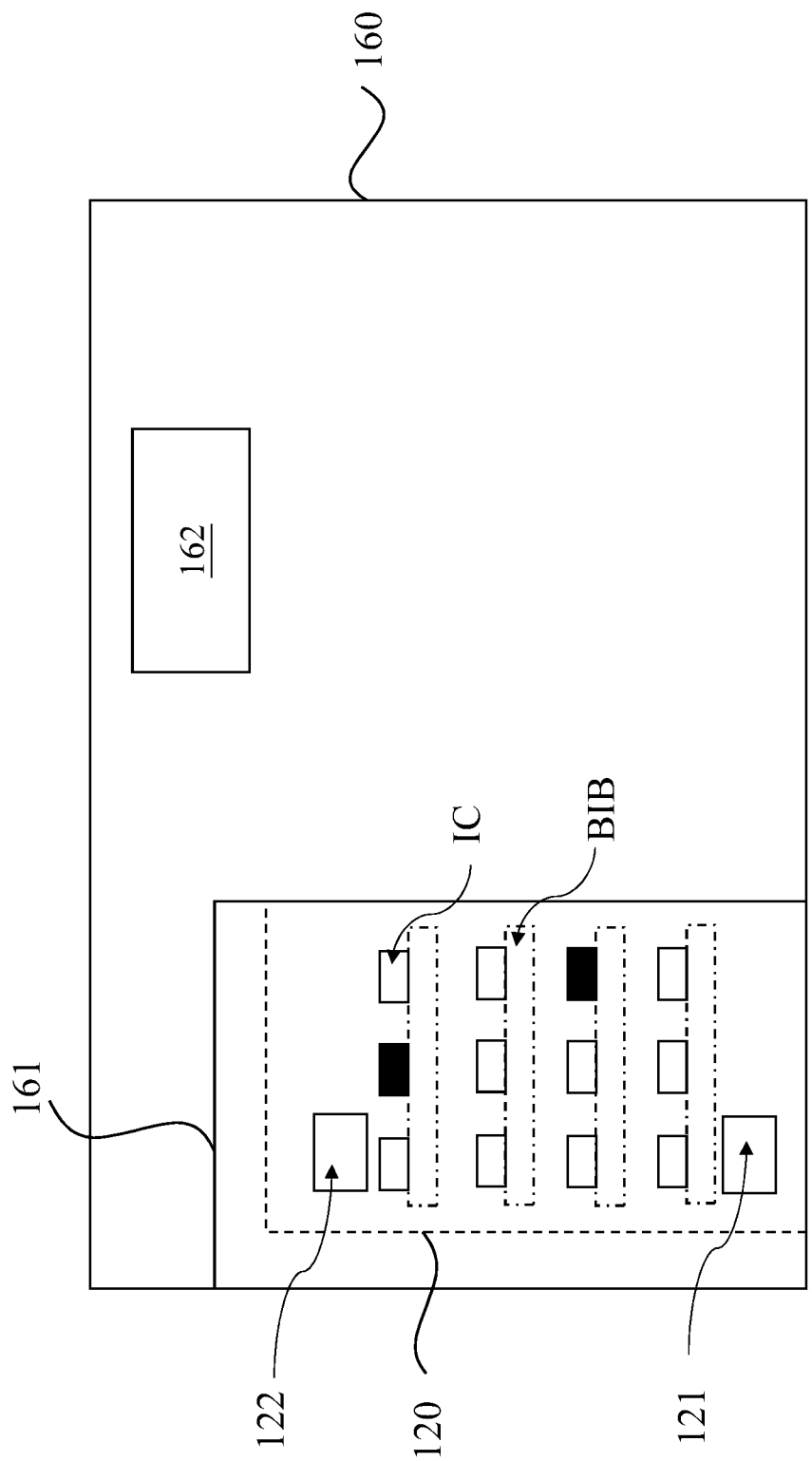

Reference is made to FIG. 12, FIG. 13, and FIG. 14. FIG. 12, FIG. 13, and FIG. 14 are schematic views of operations of the test chamber 160 and the stage wagon 120 according to some embodiments of the present disclosure.

As illustrated in FIG. 12, the stage wagon 120 provides the burn-in boards BIB with the disposed ICs to a loading port 161 of the test chamber 160. Similarly, the stage wagon 120 provides the burn-in boards BIB in their entirety to the test chamber 160 at once.

The burn-in boards BIB are transported from the stage wagon 120 to the test chamber 160 through the loading port 161. As illustrated in FIG. 13, in some embodiments, the test chamber 160 further includes a control unit 162. The control unit 162 is configured to provide electric connections to each of the burn-in boards BIB and perform the test function to the ICs on the burn-in boards BIB. Each of the burn-in boards BIB has an internal circuit which is configured to connect each of ICs thereon to the electric connections provided by the control unit 162.

After the burn-in boards BIB receives the electric connections, each of the ICs is connected to the control unit 162 through the internal circuit and the electric connection. Thus, the ICs are able to be tested by the control unit 162.

In some embodiments, the test function performed by the control unit 162 includes a pre-test and a main test.

The pre-test is performed to test whether the electric connections between the control unit 162 and each of the burn-in boards BIB are well connected, and to test whether the internal circuits well connect every ICs on each of the burn-in boards BIB. When the electric connections and the internal circuits are well connected, the control unit 162 determines the burn-in boards BIB passing the pre-test and performs the main test afterwards.

The main test is an aging test configured to detect early failures of each of ICs under stress. In the main test, the control unit 162 is configured to transmit test signals S1, S2, S3, and S4 to each of the burn-in boards BIB, respectively. It is noted that the number of burn-in boards BIB and the test signals S1-S4 are the same, but the number of the burn-in boards BIB and the test signals S1-S4 are not limited to 4. The control unit 162 is further configured to control a temperature in the test chamber 160. The ICs are tested at the temperature which is controlled by the control unit 162. In some embodiments, the ICs are tested sequentially under about 35, 90, 129, and −10° C. in the main test. In other embodiments, the ICs are tested sequentially under about 90 and 35° C. in the main test. During main test, the test signals S1-S4 are constantly transmitted to the burn-in boards BIB, and the burn-in boards BIB generate test signals S5, S6, S7, and S8 in response to the test signals S1-S4 and the temperatures in the test chamber 160. The control unit 162 is configured to receive the test signals S5-S8 from the burn-in boards BIB and determine a status of each of the ICs according to the test signals S5-S8. The status includes a pass status and a failed status. The status of each of the ICs indicates whether the corresponded IC passes the main test. The control unit 162 is configured to generate a result signal S9 which includes the status of the ICs.

The burn-in boards BIB are transported from the test chamber 160 to the stage wagon 120 after the main test is completed. To facilitate understanding, the ICs having the pass status are illustrated as hollow boxes, and the ICs having the failed status are illustrated as solid black boxes shown in FIG. 14. As illustrated in FIG. 14, there are two ICs having the failed status. The ICs having the failed status are considered to have early failures due to issue of manufacturing and/or material. In order to decrease the manufacturing cost, the ICs having the pass status will be collected to the next process, such as packaging, except for the ICs having the failed status.

Figure 15:
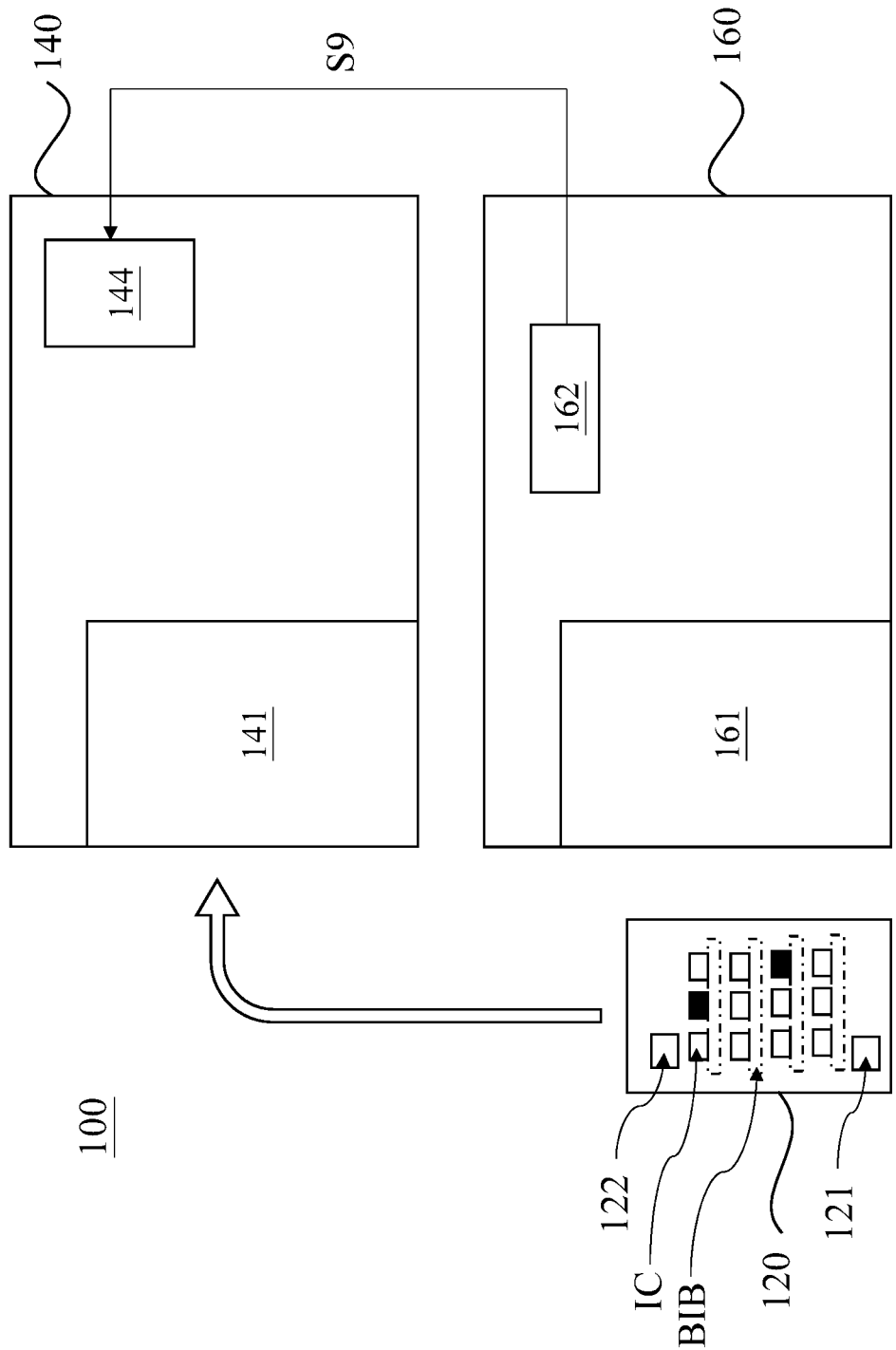
FIG. 15 is a schematic view of an IC-level test system according to some embodiments of the present disclosure.

Reference is made to FIG. 15. FIG. 15 is a schematic view of the IC-level test system 100 according to some embodiments of the present disclosure. The test chamber 160 is further configured to transmit the result signal S9 to the IC loading chamber 140, and the IC loading chamber 140 can obtain the status of each of ICs based on the result signal S9. More specifically, the IC loading chamber 140 includes a categorizing unit 144, and the result signal S9 is transmitted to the categorizing unit 144.

In some embodiments, the categorizing unit 144 is configured to categorize each of the ICs according to the result signal S9.

Figure 16:
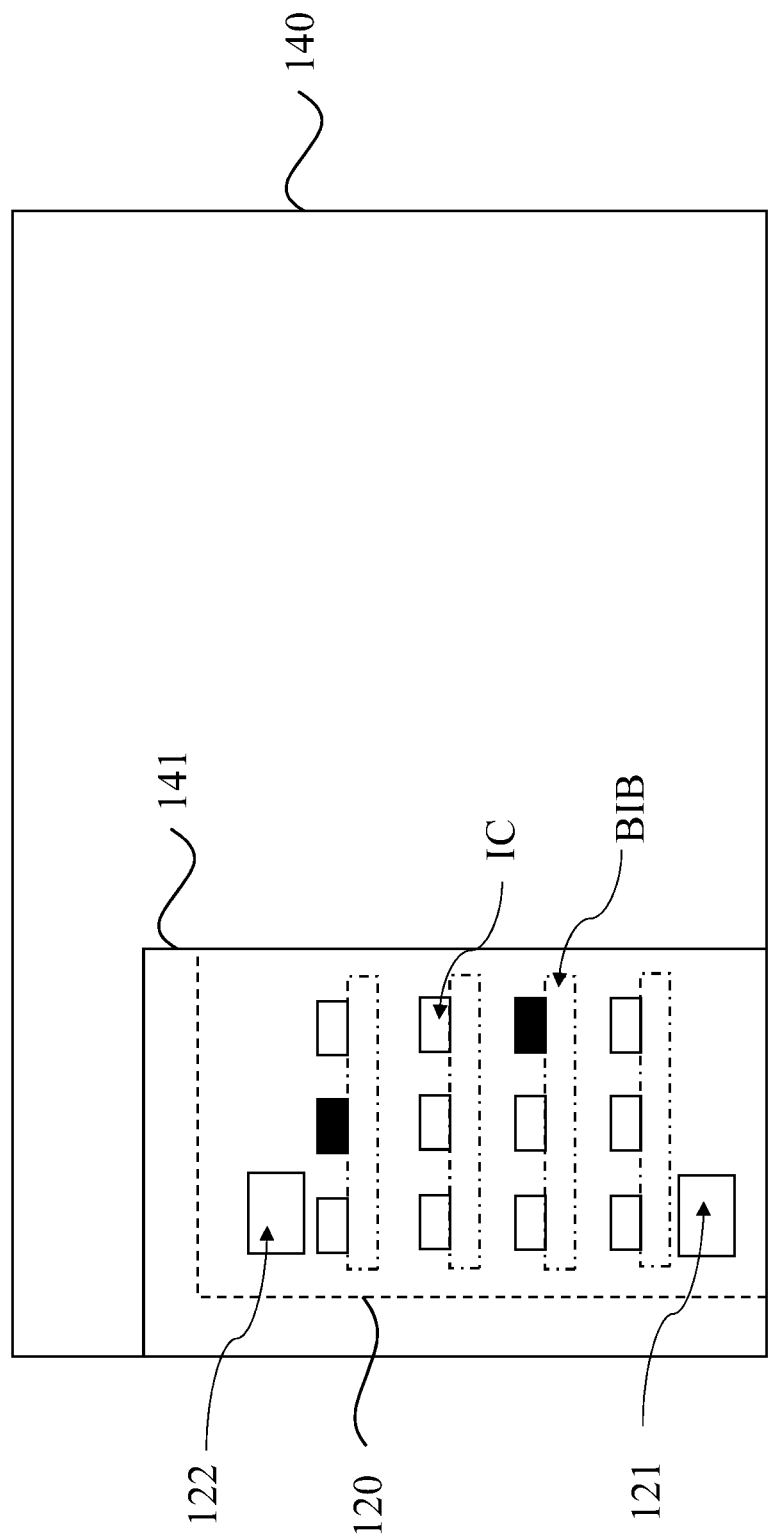
FIG. 16 and FIG. 17 are schematic views of operations of an IC loading chamber and a stage wagon with the tested ICs according to some embodiments of the present disclosure.

Reference is made to FIG. 16. FIG. 16 is a schematic view of an operation of the IC loading chamber 140 and the stage wagon 120 with the tested ICs according to some embodiments of the present disclosure.

After the burn-in boards BIB are transported back to the stage wagon 120, the stage wagon 120 then provides the burn-in boards BIB to the IC loading chamber 140 again. The stage wagon 120 provides the burn-in boards BIB to the IC loading chamber 140 through the loading port 141.

Figure 17:
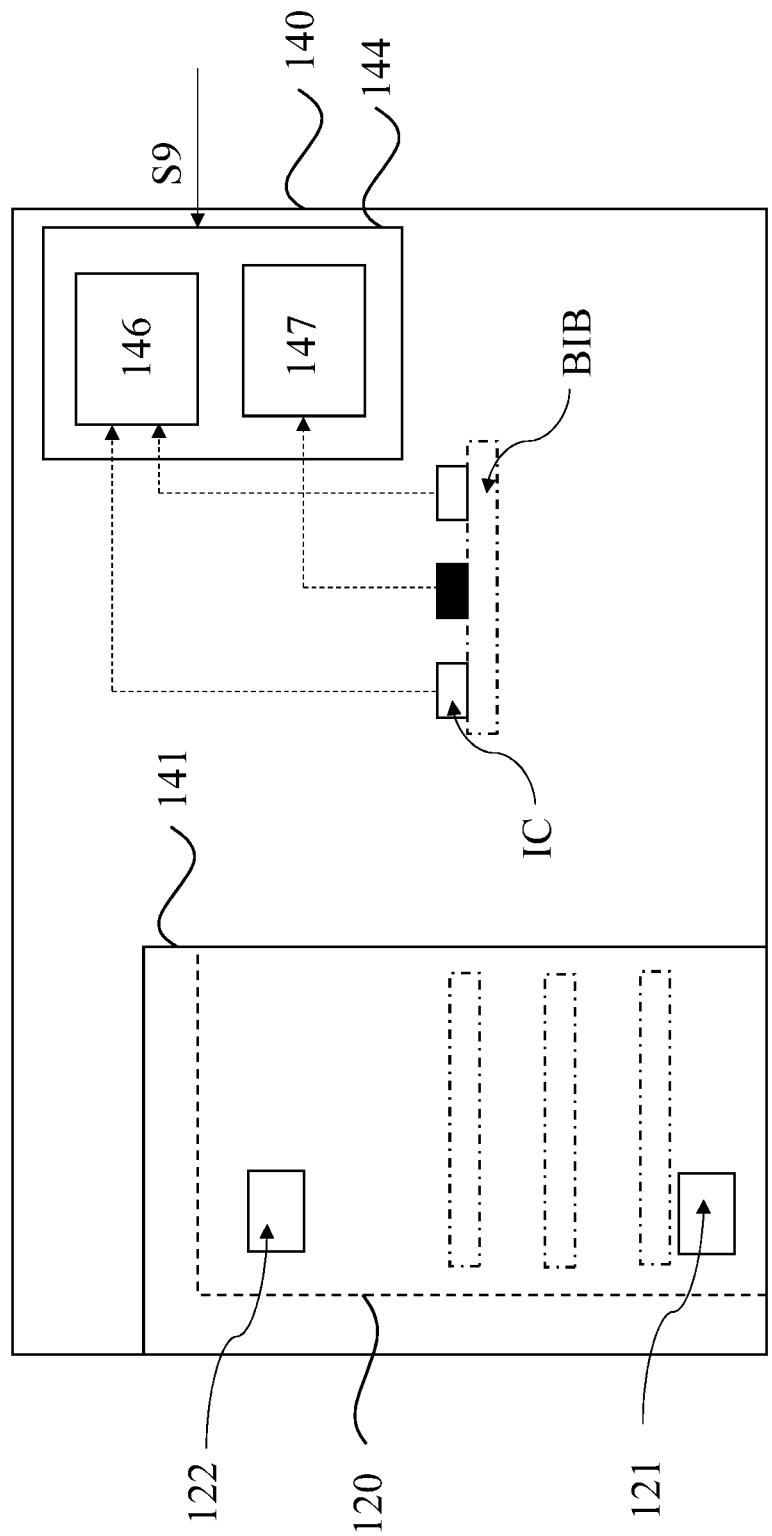

Reference is made to FIG. 17. FIG. 17 is a schematic view of an operation of the IC loading chamber 140 and the stage wagon 120 with the tested ICs according to some embodiments of the present disclosure.

The categorizing unit 144 is configured to categorize the tested ICs according to the status carried by the result signal S9, and collect the ICs having the pass status for the next process. The categorizing unit 144 includes a first bank 146 and a second bank 147. The first bank 146 is configured to receive the ICs having the pass status collected by the categorizing unit 144, and the second band 147 is configured to receive the rest of ICs which have the failed status. In some embodiments, the ICs having the failed status are removed from a process line. In some embodiments, the ICs are moved by the mechanical art (not shown in FIG. 17) from the burn-in boards BIB to the categorizing unit 144.

After the ICs are collected by the categorizing unit 144, the burn-in boards BIB are transported to the stage wagon 120.

Figure 18:
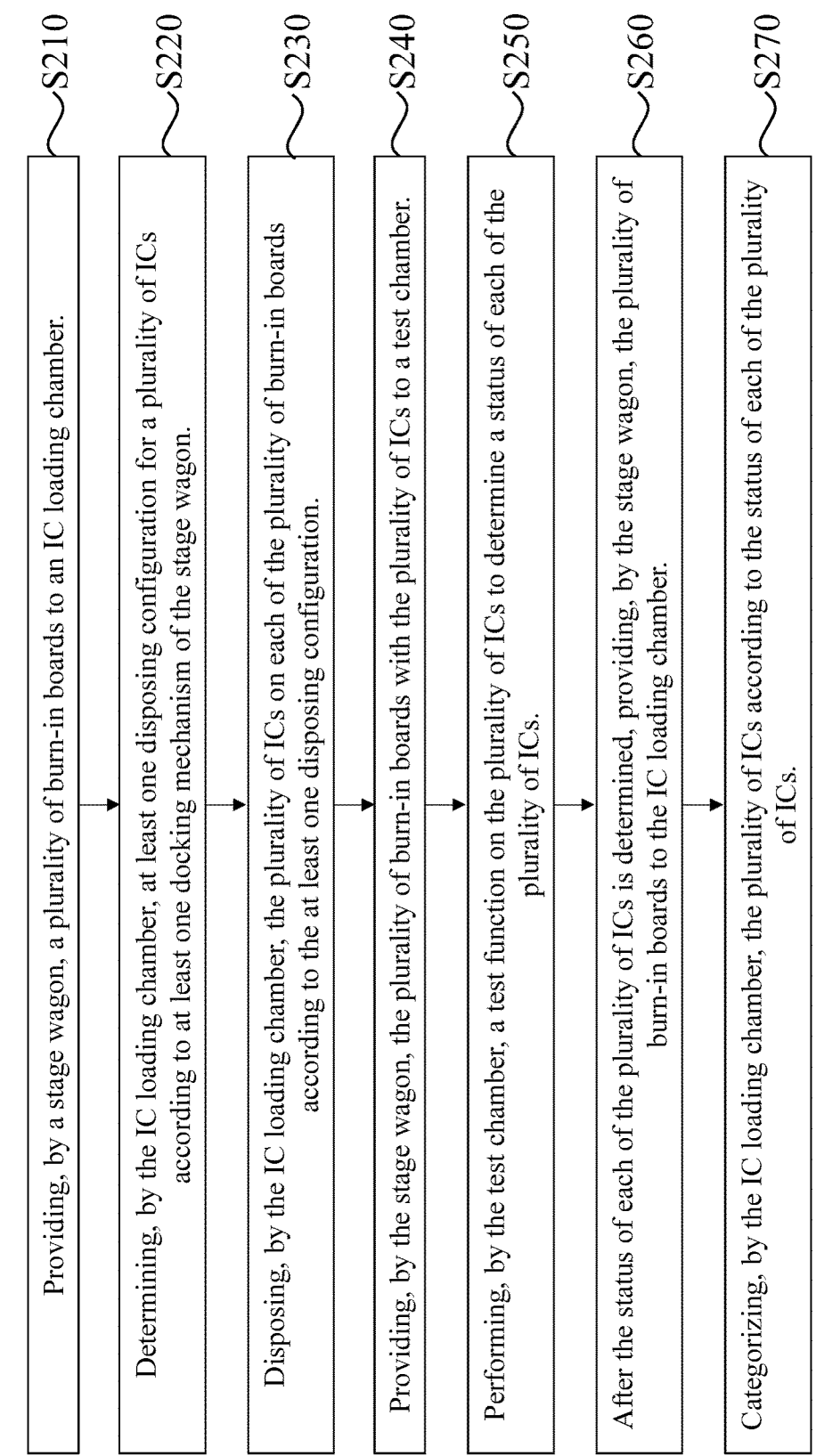
FIG. 18 is a flowchart of an IC-level test method according to some embodiments of the present disclosure.

Reference is made to FIG. 18. FIG. 18 is a flowchart of an IC-level test method 200 according to some embodiments of the present disclosure. The IC-level test method 200 is applied by the IC-level test system 100 with reference to FIG. 1 to FIG. 17. The IC-level test method 200 is configured to test the ICs whether each of the ICs meets the minimum requirements.

As illustrated in FIG. 18, the IC-level test method 200 includes an operations S210, an operations S220, an operations S230, an operations S240, an operations S250, an operations S260, and an operations S270.

In operation S210, the burn-in boards BIB are provided by the stage wagon 120 to the IC loading chamber 140.

In operation S220, the disposing configuration for the ICs is determined by the IC loading chamber 140 according to the docking mechanism 121 and the docking mechanism 122 of the stage wagon 120.

In operation S230, the ICs are disposed on each of the burn-in boards BIB according to the disposing configuration determined in the operation S220.

In operation S240, the burn-in boards BIB with the ICs are provided to the test chamber 160.

In operation S250, the test function is performed on the ICs by the test chamber 160, so as to determine a status of each of the ICs.

In operation S260, after the status of each of the ICs is determined, the burn-in boards BIB are provided by the stage wagon 120 to the IC loading chamber 140.

In operation S270, the ICs are categorized by the IC loading chamber 140 according to the status of each of the ICs.

Figure 19:
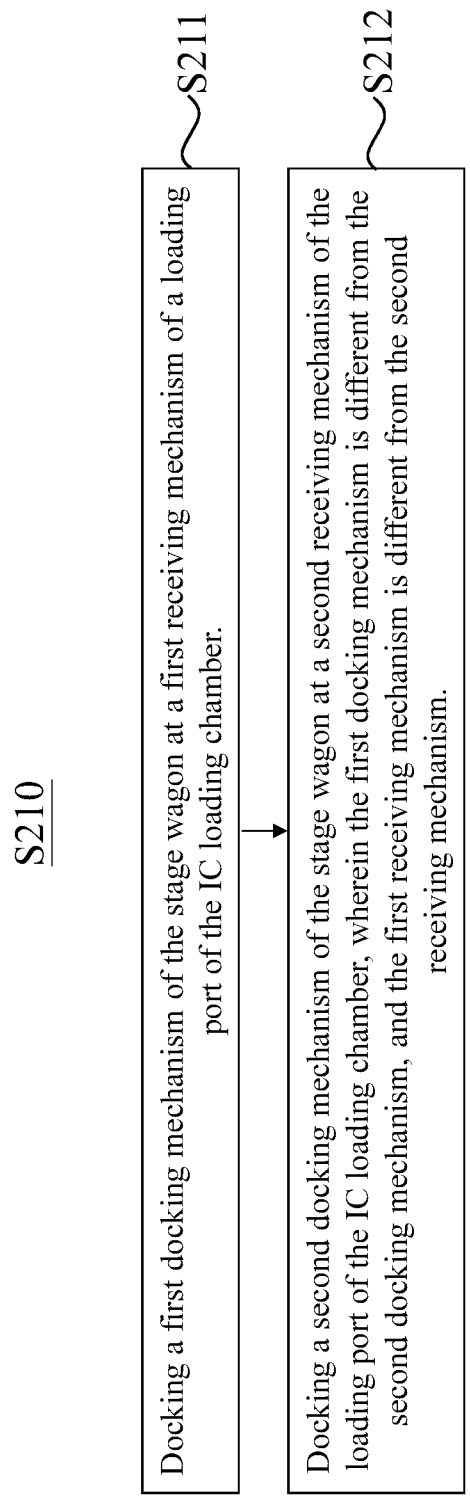
FIG. 19, FIG. 20, FIG. 21, and FIG. 22 are detailed flowcharts of the IC-level test method shown in FIG. 18 according to some embodiments of the present disclosure.

Reference is made to FIG. 19. FIG. 19 is a detailed flowchart of the operation S210 of the IC-level test method 200 shown in FIG. 18 according to some embodiments of the present disclosure. As illustrated in FIG. 19, the operation S210 includes an operation S211 and an operation S212.

In operation S211, the docking mechanism 121 of the stage wagon 120 is docked at the receiving mechanism 142 of the loading port 141 of the IC loading chamber 140.

In operation S212, the docking mechanism 122 of the stage wagon 120 is docked at the receiving mechanism 143 of the loading port 141 of the IC loading chamber 140 The docking mechanism 121 is different from the docking mechanism 122, and the receiving mechanism 142 is different from the receiving mechanism 143.

Figure 20:
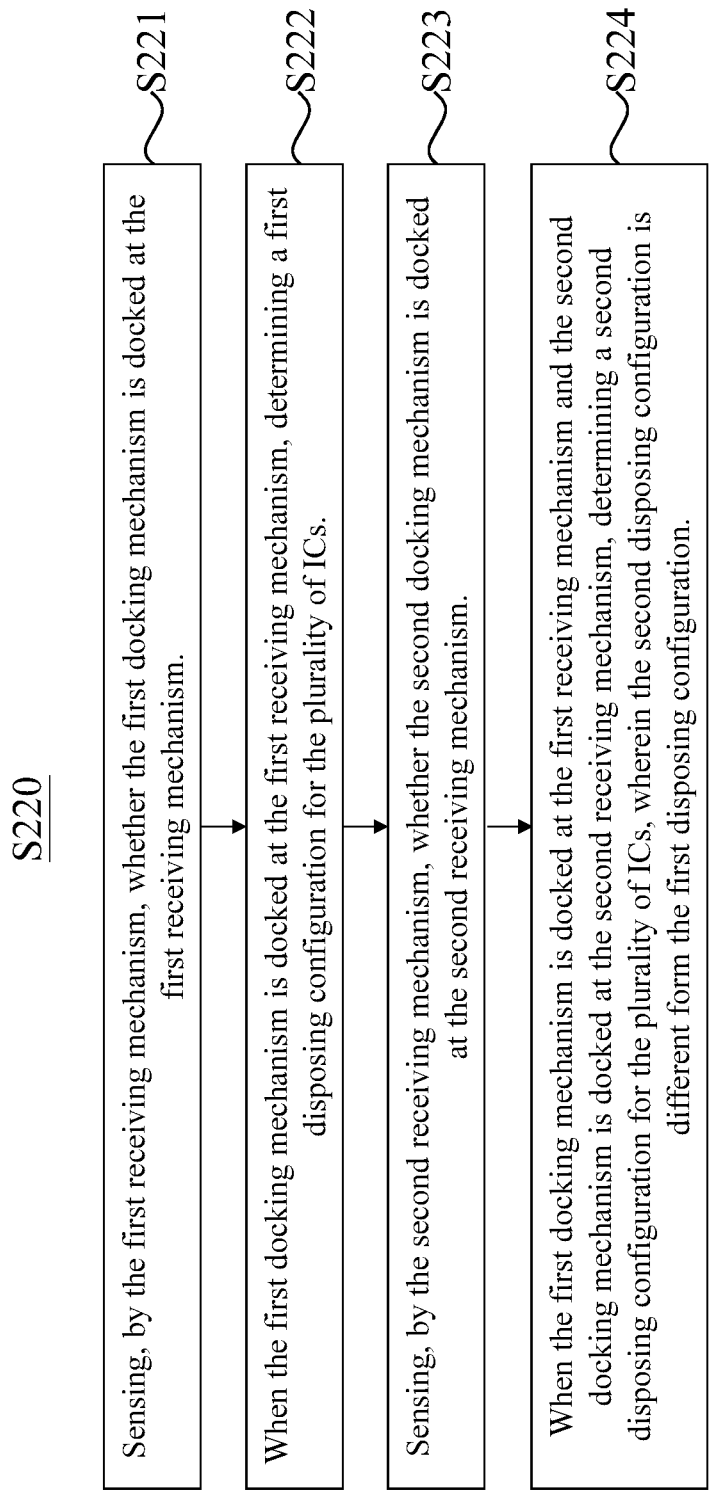

Reference is made to FIG. 20. FIG. 20 is a detailed flowchart of the operation S220 of the IC-level test method 200 shown in FIG. 18 according to some embodiments of the present disclosure. As illustrated in FIG. 20, the operation S220 includes an operation S221, an operation S222, operation S223, and an operation S224.

In operation S221, the receiving mechanism 142 senses whether the docking mechanism 121 is docked at the receiving mechanism 142.

In operation S222, when the docking mechanism 121 is to docked at the receiving mechanism 142, a first disposing configuration for the ICs is determined.

In operation S223, the receiving mechanism 143 senses whether the docking mechanism 122 is docked at the receiving mechanism 143.

In operation S224, when the docking mechanism 121 is docked at the receiving mechanism 142 and the docking mechanism 122 is docked at the receiving mechanism 143, a second disposing configuration for the ICs is determined.

The second disposing configuration is different from the first disposing configuration. In some embodiments, the first disposing configuration corresponds to the disposing configuration shown in FIG. 11a, and the second disposing configuration corresponds to the disposing configuration shown in FIG. 11b. In other embodiments, the first disposing configuration corresponds to the disposing configuration shown in FIG. 11b, and the second disposing configuration corresponds to the disposing configuration shown in FIG. 11a.

Figure 21:
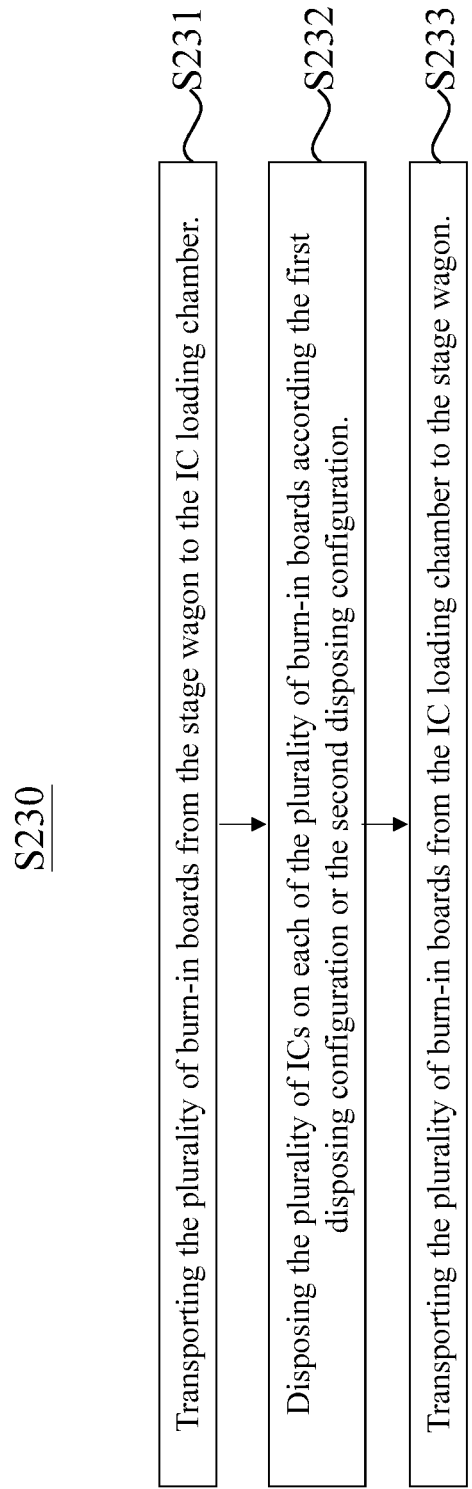

Reference is made to FIG. 21. FIG. 21 is a detailed flowchart of the operation S230 of the IC-level test method 200 shown in FIG. 18 according to some embodiments of the present disclosure. As illustrated in FIG. 21, the operation S230 includes an operation S231, an operation S232, and an operation S233.

In operation S231, the burn-in boards BIB are transported from the stage wagon 120 to the IC loading chamber 140.

In operation S232, the ICs are disposed on each of the burn-in boards BIB according the first disposing configuration or the second disposing configuration.

In operation S233, the burn-in boards BIB are transported from the IC loading chamber 140 to the stage wagon 120.

Figure 22:
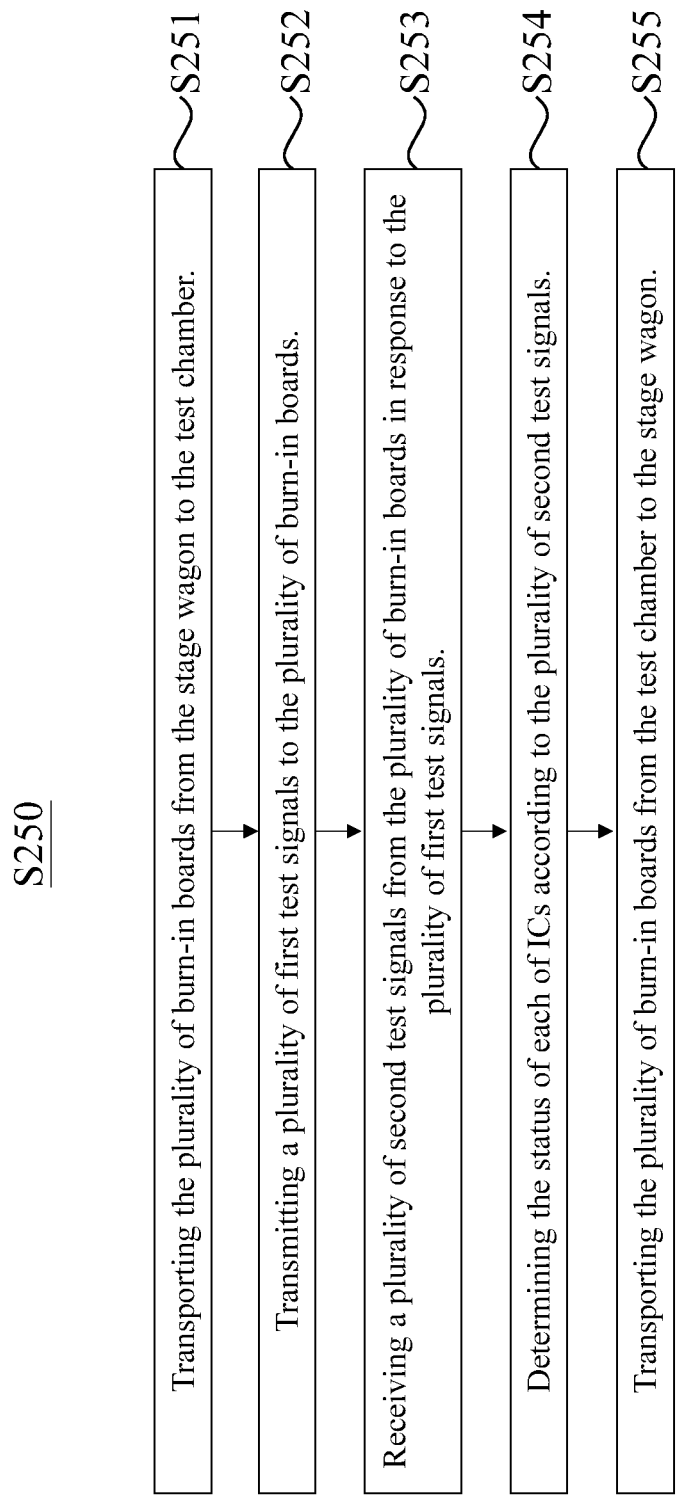

Reference is made to FIG. 22. FIG. 22 is a detailed flowchart of the operation S250 of the IC-level test method 200 shown in FIG. 18 according to some embodiments of the present disclosure. As illustrated in FIG. 22, the operation S250 includes an operation S251, an operation S252, and an operation S253.

In operation S251, the burn-in boards BIB are transported from the stage wagon 120 to the test chamber 160.

In operation S252, the test signals S1-S4 are transmitted to the burn-in boards BIB, respectively.

In operation S253, the test signal S5-S8 are received from the burn-in boards BIB in response to the test signals S1-S4, respectively.

In operation S254, the status of each of the ICs is determined according to the test signals S5-S8.

In operation S255, the burn-in boards BIB are transported from the test chamber 160 to the stage wagon 120.

One aspect of the present disclosure provides an integrated-circuit-level (IC-level) test method. The IC-level test method includes the operations of providing, by a stage wagon, a plurality of burn-in boards to an IC loading chamber; determining, by the IC loading chamber, at least one disposing configuration for a plurality of ICs according to at least one docking mechanism of the stage wagon; disposing, by the IC loading chamber, the plurality of ICs on each of the plurality of burn-in boards according to the at least one disposing configuration; providing, by the stage wagon, the plurality of burn-in boards with the plurality of ICs to a test chamber; and performing, by the test chamber, a test function on the plurality of ICs to determine a status of each of the plurality of ICs.

Another aspect of the present disclosure provides an IC-level system. The IC-level test system includes a stage wagon, an IC loading chamber, and a test chamber. The stage wagon is configured to provide a plurality of burn-in boards. The stage wagon includes at least one docking mechanism. The IC loading chamber is configured to determine at least one disposing configuration for a plurality of ICs according to the at least one docking mechanism of the stage wagon, and configured to disposing the plurality of ICs on each of the plurality of burn-in boards according to the at least one disposing configuration. The test chamber is configured to perform a test function on the plurality of ICs to determine a status of each of the plurality of ICs.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. An integrated-circuit-level (IC-level) test method, comprising:
   providing, by a stage wagon, a plurality of burn-in boards to an IC loading chamber;
   determining, by the IC loading chamber, at least one disposing configuration for a plurality of ICs according to at least one docking mechanism of the stage wagon;
   disposing, by the IC loading chamber, the plurality of ICs on each of the plurality of burn-in boards according to the at least one disposing configuration;
   providing, by the stage wagon, the plurality of burn-in boards with the plurality of ICs to a test chamber; and
   performing, by the test chamber, a test function on the plurality of ICs to determine a status of each of the plurality of ICs.

2. The IC-level test method of claim 1, further comprising:
   after the status of each of the plurality of ICs is determined, providing, by the stage wagon, the plurality of burn-in boards to the IC loading chamber; and
   categorizing, by the IC loading chamber, the plurality of ICs according to the status of each of the plurality of ICs.

3. The IC-level test method of claim 1, wherein providing the plurality of burn-in boards to the IC loading chamber comprises:
   docking a first docking mechanism of the stage wagon at a first receiving mechanism of a loading port of the IC loading chamber.

4. The IC-level test method of claim 3, wherein determining the at least one disposing configuration according to the at least one docking mechanism of the stage wagon comprises:
   sensing, by the first receiving mechanism, whether the first docking mechanism is docked at the first receiving mechanism; and
   when the first docking mechanism is docked at the first receiving mechanism, determining a first disposing configuration for the plurality of ICs.

5. The IC-level test method of claim 4, wherein providing the plurality of burn-in boards to the IC loading chamber further comprises:
   docking a second docking mechanism of the stage wagon at a second receiving mechanism of the loading port of the IC loading chamber, wherein the first docking mechanism is different from the second docking mechanism, and the first receiving mechanism is different from the second receiving mechanism.

6. The IC-level test method of claim 5, wherein determining the at least one disposing configuration according to the at least one docking mechanism of the stage wagon further comprises:
sensing, by the second receiving mechanism, whether the second docking mechanism is docked at the second receiving mechanism; and
when the first docking mechanism is docked at the first receiving mechanism and the second docking mechanism is docked at the second receiving mechanism, determining a second disposing configuration for the plurality of ICs, wherein the second disposing configuration is different from the first disposing configuration.

7. The IC-level test method of claim 6, wherein disposing the plurality of ICs on each of the plurality of burn-in boards according to the at least one disposing configuration comprises:
transporting the plurality of burn-in boards from the stage wagon to the IC loading chamber;
disposing the plurality of ICs on each of the plurality of burn-in boards according the first disposing configuration or the second disposing configuration; and
transporting the plurality of burn-in boards from the IC loading chamber to the stage wagon.

8. The IC-level test method of claim 7, wherein the plurality of burn-in boards are transported in their entirety at once from the stage wagon to the IC loading chamber.

9. The IC-level test method of claim 1, wherein performing the test function on the plurality of ICs to determine the status of each of the plurality of ICs comprises:
transporting the plurality of burn-in boards from the stage wagon to the test chamber;
transmitting a plurality of first test signals to the plurality of burn-in boards;
receiving a plurality of second test signals from the plurality of burn-in boards in response to the plurality of first test signals;
determining the status of each of the plurality of ICs according to the plurality of second test signals; and
transporting the plurality of burn-in boards from the test chamber to the stage wagon.

10. The method of claim 9, wherein the plurality of burn-in boards are transported in their entirety at once from the stage wagon to the test chamber.

11. An IC-level test system, comprising:
a stage wagon, configured to provide a plurality of burn-in boards, wherein the stage wagon comprises at least one docking mechanism;
an IC loading chamber configured to determine at least one disposing configuration for a plurality of ICs according to the at least one docking mechanism of the stage wagon, and configured to disposing the plurality of ICs on each of the plurality of burn-in boards according to the at least one disposing configuration; and
a test chamber configured to perform a test function on the plurality of ICs to determine a status of each of the plurality of ICs.

12. The IC-level test system of claim 11, wherein the IC loading chamber is further configured to categorize the plurality of ICs according to the status of each of the plurality of ICs.

13. The IC-level test system of claim 11, wherein the stage wagon comprises a first docking mechanism, and the IC loading chamber comprises:
a loading port, comprising:
a first receiving mechanism, configured to dock the first docking mechanism of the stage wagon.

14. The IC-level test system of claim 13, wherein the IC loading chamber is further configured to sense whether the first docking mechanism is docked at the first receiving mechanism by the first receiving mechanism,
wherein when the first docking mechanism is docked at the first receiving mechanism, the IC loading chamber determines a first disposing configuration for the plurality of ICs.

15. The IC-level test system of claim 14, wherein the stage wagon further comprises a second docking mechanism, and the loading port of the IC loading chamber further comprises a second receiving mechanism, wherein the second receiving mechanism is configured to dock the second docking mechanism of the stage wagon,
wherein the first docking mechanism is different from the second docking mechanism, and the first receiving mechanism is different from the second receiving mechanism.

16. The IC-level test system of claim 15, wherein the IC loading chamber is further configured to sense whether the second docking mechanism is docked at the second receiving mechanism by the second receiving mechanism,
wherein when the first docking mechanism and the second docking mechanism are docked at the first receiving mechanism and the second receiving mechanism, respectively, the IC loading chamber determines a second disposing configuration for the plurality of ICs, wherein the second disposing configuration is different from the first disposing configuration.

17. The IC-level test system of claim 16, wherein the stage wagon is configured to provide the plurality of burn-in boards by transporting the plurality of burn-in boards from the stage wagon to the loading port of the IC loading chamber.

18. The IC-level test system of claim 17, wherein the plurality of burn-in boards are transported in their entirety at once from the stage wagon to the loading port of the IC loading chamber.

19. The IC-level test system of claim 1, wherein the stage wagon is configured to provide the plurality of burn-in boards by transporting the plurality of burn-in boards from the stage wagon to the test chamber.

20. The IC-level test system of claim 19, wherein the plurality of burn-in boards are transported in their entirety at once from the stage wagon to the test chamber.

* * * * *